United States Patent
Hisanori

(10) Patent No.: US 8,956,908 B2
(45) Date of Patent: Feb. 17, 2015

(54) IMAGE SENSORS AND METHODS OF MANUFACTURING THE SAME

(71) Applicant: Samsung Electronics Co., Ltd., Suwon-Si, Gyeonggi-Do (KR)

(72) Inventor: Ihara Hisanori, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/456,399

(22) Filed: Aug. 11, 2014

(65) Prior Publication Data

US 2014/0349437 A1    Nov. 27, 2014

Related U.S. Application Data

(62) Division of application No. 13/613,709, filed on Sep. 13, 2012, now Pat. No. 8,823,070.

(30) Foreign Application Priority Data

Jan. 30, 2012  (KR) .......................... 10-2012-0009154

(51) Int. Cl.
   *H01L 21/00*   (2006.01)
   *H01L 27/146*  (2006.01)
   *H01L 29/66*   (2006.01)

(52) U.S. Cl.
   CPC .... *H01L 27/14689* (2013.01); *H01L 29/66666* (2013.01)
   USPC .................. 438/59; 438/78; 438/83; 438/98

(58) Field of Classification Search
   CPC .................. H01L 27/14636; H01L 27/14638; H01L 27/14603
   USPC .................. 257/291–293, E31.083–E31.085; 438/59–61, 78, 83, 98
   See application file for complete search history.

(56) References Cited

U.S. PATENT DOCUMENTS

| | | | |
|---|---|---|---|
| 6,232,626 B1 | 5/2001 | Rhodes | |
| 8,716,769 B2 * | 5/2014 | Ihara et al. | ..................... 257/291 |
| 2011/0108897 A1 | 5/2011 | Koo et al. | |

* cited by examiner

*Primary Examiner* — Fernando L Toledo
*Assistant Examiner* — Victoria K Hall
(74) *Attorney, Agent, or Firm* — Harness, Dickey & Pierce, P.L.C.

(57) ABSTRACT

In image sensors and methods of manufacturing the same, a substrate has a photoelectric conversion area, a floating diffusion area and a recess between the photoelectric conversion area and the floating diffusion area. A plurality of photodiodes is vertically arranged inside the substrate in the photoelectric conversion area. A transfer transistor is arranged along a surface profile of the substrate having the recess and configured to transfer electric charges generated from the plurality of photodiodes to the floating diffusion area. The transfer transistor includes a gate insulation pattern on a sidewall and a bottom of the recess and on a surface of the substrate around the recess, and a gate conductive pattern including polysilicon doped with impurities and positioned on the gate insulation pattern along the surface profile of the substrate having the recess, wherein a cavity is in an upper surface of the gate conductive pattern.

7 Claims, 13 Drawing Sheets

1000

IMAGE SENSORS AND METHODS OF MANUFACTURING THE SAME

CROSS-REFERENCE TO RELATED APPLICATIONS

This application is a divisional of U.S. application Ser. No. 13/613,709, filed on Sep. 13, 2012 and claims the benefit of priority under 35 U.S.C. §119 from Korean Patent Application No. 10-2012-0009154 filed on Jan. 30, 2012 in the Korean Intellectual Property Office, the entire contents of each of which are hereby incorporated herein by reference.

BACKGROUND

1. Field

Example embodiments relate to image sensors and methods of manufacturing the same, and more particularly, to image sensors having a vertical transfer gate transistor and methods of manufacturing the same.

2. Description of the Related Art

An image sensor includes a semiconductor device for transforming optical image signals into electric signals. The image sensors are generally classified into a charge coupled device (CCD) type and a complementary metal oxide semiconductor (CMOS) type. The CMOS type image sensor usually includes a plurality of pixels that are arranged in two dimensions, and each of the pixels includes a photodiode. Recently, the size of the pixel is gradually decreased as the integration degree of the semiconductor devices increases, and thus the size of the photodiode is also reduced in the pixel.

SUMMARY

Example embodiments relate to image sensors and methods of manufacturing the same, and more particularly, to image sensors having a vertical transfer gate transistor and methods of manufacturing the same.

Example embodiments relate to high performance image sensors of high integration degree, thereby preventing an image lag.

Other example embodiments relate to methods of manufacturing the above image sensor.

According to some example embodiments, there is provided an image sensor including a substrate having a photoelectric conversion area, a floating diffusion area and a recess between the photoelectric conversion area and the floating diffusion area. A plurality of photodiodes is vertically arranged inside the substrate at the photoelectric conversion area. A transfer transistor is arranged along a surface profile of the substrate having the recess and configured to transfer electric charges generated from the plurality of photodiodes to the floating diffusion area. The transfer transistor includes a gate insulation pattern on a sidewall and a bottom of the recess and a surface of the substrate around the recess, and a gate conductive pattern, including polysilicon doped with impurities, on the gate insulation pattern along the surface profile of the substrate having the recess. A cavity is in at an upper surface of the gate conductive pattern.

In example embodiments, a doping concentration of the impurities may be uniform along a thickness of the gate conductive pattern.

In example embodiments, the gate conductive pattern may include a first gate conductive pattern having a first doping concentration and a second gate conductive pattern under the first gate conductive pattern. The second gate conductive pattern has a second doping concentration lower than the first doping concentration.

In example embodiments, a thickness of the second gate conductive pattern may be less than about 30% of a thickness of the gate conductive pattern.

In example embodiments, a thickness of the gate conductive pattern is less than a half of a width the recess.

In example embodiments, a corner angle of the substrate around the recess, defined as an angle between the sidewall of the recess and the surface of the substrate, may be in a range of 90° to 140°.

In example embodiments, the image sensor may further include an insulation interlayer on the substrate and covering the transfer transistor, and a contact plug extending through the insulation interlayer and contacting the gate conductive pattern on a portion of gate conductive pattern spaced apart from the cavity.

In example embodiments, the contact plug may contact the gate conductive pattern of the transfer transistor over the surface of the substrate adjacent to the recess.

According to some example embodiments, there is provided a method of manufacturing the image sensor. A plurality of photodiodes is formed inside a photoelectric conversion area of a substrate on which a floating diffusion area is separated from the photoelectric conversion area. The photodiodes are arranged in a vertical direction. A recess is formed on the substrate between the photoelectric conversion area and the floating diffusion area, and a gate insulation layer is formed along a surface profile of the substrate having the recess. The gate insulation layer is formed on a sidewall and bottom of the recess and on the surface of the substrate around the recess. A pure polysilicon layer is formed on the gate insulation layer along the surface profile of the substrate. Impurities are implanted into the pure polysilicon layer to form a gate conductive layer of polysilicon doped with impurities on the gate insulation layer along the surface profile of the substrate having the recess. The gate insulation layer and the gate conductive layer may be patterned to form a transfer gate electrode including a gate insulation pattern and a gate conductive pattern having the polysilicon doped with the impurities along the surface profile of the substrate having the recess. The transfer gate electrode is formed on the sidewall and the bottom of the recess and on the surface of the substrate around the recess and including a cavity over a central portion of the recess.

In example embodiments, implanting the impurities into the pure polysilicon layer may include performing a first ion implantation process, a second ion implantation process and a third ion implantation process. The first ion implantation process may implant the impurities in a vertical line perpendicular to the surface of the substrate. The second and the third ion implantation process may implant the impurities at a slant angle with respect to the surface of the substrate in a counterclockwise or clockwise direction, respectively, from the vertical line.

In example embodiments, the impurities may be implanted into the pure polysilicon layer at a uniform doping concentration throughout an entire thickness of the pure polysilicon layer such that the doping concentration of the gate conductive layer is uniform along a thickness of the gate conductive layer.

In example embodiments, the impurities may be implanted into an upper portion of the pure polysilicon layer at a first doping concentration and may be implanted into a lower portion of the polysilicon layer at a second doping concentration lower than the first doping concentration such that the gate conductive layer includes a first doped polysilicon layer having the first doping concentration and a second doped polysilicon layer having the second doping concentration under the first doped polysilicon layer.

In example embodiments, a thickness of the gate conductive layer may be uniform along the surface profile of the substrate including the recess such that the thickness of the gate conductive layer may be less than a half of an inner width of the recess.

In example embodiments, forming the recess on the substrate may include performing an etching process. A corner angle of the substrate between the surface of the substrate and the sidewall of the recess may be in a range of 90° to about 140° after performing the etching process.

In example embodiments, after formation of the gate electrode of the transfer transistor, an insulation interlayer may be formed on the substrate and covering the transfer gate electrode. A contact plug may extend through the insulation interlayer and may contact the gate electrode apart on a portion of the gate electrode spaced apart from the cavity.

According to other example embodiments, an image sensor includes a substrate having a photoelectric conversion area, a floating diffusion area and a recess between the photoelectric conversion area and the floating diffusion area. A plurality of photodiodes overlapping each other is in the photoelectric conversion area. A transfer transistor is in the recess and over an upper surface of the substrate adjacent to the recess, and configured to transfer electric charges generated from the plurality of photodiodes to the floating diffusion area. An upper surface of the transfer transistor has a non-planar portion over the recess of the substrate. The transfer transistor includes a gate insulation pattern over opposing sidewalls and a bottom of the recess and the upper surface of the substrate adjacent to the recess. The transfer transistor also includes a gate conductive pattern, which includes polysilicon doped with impurities, over the gate insulation pattern. An upper surface of the gate conductive pattern is conformal with the upper surface of the substrate adjacent to the recess, and the opposing sidewalls and the bottom of the recess.

The non-planar portion of the upper surface of the transfer transistor may be in the form of a cavity in the upper surface of the gate conductive pattern.

The upper surface of the transfer transistor may have a planar portion extending over the recess and the upper surface of the substrate adjacent to the recess.

The gate conductive pattern may include a highly-doped region over a lightly-doped region having a doping concentration lower than a doping concentration of the highly-doped region. The highly-doped region may include a first highly-doped region over a second highly-doped region having a doping concentration lower than a doping concentration of the first highly-doped region.

According to example embodiments, the transfer gate of the image sensor may be formed into a vertical type that may be recessed in the recess of the substrate and may have a cavity at an upper surface thereof corresponding to the central portion of the recess. Due to the cavity, the transfer gate may have a uniform doping concentration along the surface profile of the substrate including the recess. That is, the doping concentration of the transfer gate on the surface of the substrate may be substantially the same as that of the transfer gate in the recess. Accordingly, the vertical transfer gate of the image sensor may have uniform doping concentration in spite of the non-uniformity of the substrate such as the recess, thereby improving the full-well capacity (the maximum number of charges that can be held in the photodiode) of the pixel of the image sensor. As a result, the drive range of the image sensor may be enlarged and the operation failures (e.g., image lag) may be minimized. In addition, the cavity of the transfer gate may be easily formed without any additional processes, thereby increasing the operation reliability of the image sensor without performing additional processes.

BRIEF DESCRIPTION OF THE DRAWINGS

Example embodiments will be more clearly understood from the following detailed description taken in conjunction with the accompanying drawings.

DETAILED DESCRIPTION OF THE EMBODIMENTS

Figure 1:
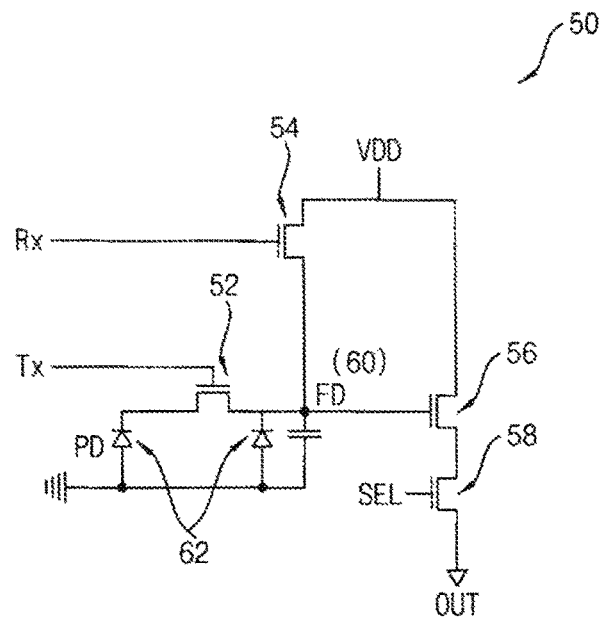
FIG. 1 is a circuit diagram showing a pixel of an image sensor in accordance with example embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Example embodiments relate to image sensors and methods of manufacturing the same, and more particularly, to image sensors having a vertical transfer gate transistor and methods of manufacturing the same.

FIG. 1 is a circuit diagram showing a pixel of an image sensor in accordance with example embodiments.

Referring to FIG. 1, a pixel 50 of an image sensor in accordance with example embodiments may include a photoelectric conversion device (PD) and an electronic circuit configured to generate signals.

The photoelectric conversion device (PD) may be activated by optical signals and may generate charges according to the optical signals. For example, the photoelectric conversion device (PD) may include one of a photodiode, a photo transistor, a photo-gate and a pinned photo diode (PPD). In the present example embodiments, the photoelectric conversion device PD may include at least two photodiodes 62 that may be stacked in a vertical direction to improve the photoelectric conversion effect.

The electric circuit may generate electric signals according to the photoelectric conversion electrons. The pixel may be classified into 1-transistor type, 3-transistor type, 4-transistor type and 5-transistor type according to a number of transistors in the electric circuit. Otherwise, a plurality of the pixels may share some transistors of the electric circuit. In the present example embodiments, the 4-transistor type pixel 50 is shown in FIG. 1. That is, the pixel 50 may include a transfer transistor 52, a reset transistor 54, a drive transistor 56 and a selection transistor 58 and a floating diffusion node 60 may be provided in the pixel 50.

In example embodiments, a gate electrode of the transfer transistor 52 may extend to a recess of a substrate. A first terminal of the transfer transistor 52 may be connected to the photodiode 62 and a second terminal may be connected to the floating diffusion node 60. A transfer signal Tx may be applied to the gate electrode of the transfer transistor 52. The electrons generated from the photodiode 62 may be transferred to the floating diffusion node 60 by the transfer transistor 52.

A power voltage VDD may be applied to a first terminal of the reset transistor 54 and a second terminal of the reset transistor 54 may be connected to the floating diffusion node 60. A reset signal Rx may be applied to the gate electrode of the reset transistor 54. Thus, the floating diffusion node 60 may be commonly connected to impurity areas of the reset transistor 54 and the transfer transistor 52. The floating diffusion node 60 may be periodically reset by the reset transistor 54.

The power voltage VDD may also be applied to a first terminal of the drive transistor 56, and the gate electrode of the drive transistor 56 may also be connected to the floating diffusion node 60 via a contact plug and a wiring. The electrons of the floating diffusion node 60 may be amplified by the drive transistor 56, and thus the drive transistor may function as a source follower.

The selection transistor 58 may be connected to the drive transistor 56 in series and may include a first terminal connected to a second terminal of the drive transistor 56, a gate electrode to which a selection signal SEL may be applied and a second terminal for transferring an output signal OUT. The selection transistor 58 may transfer an output signal of the drive transistor 56 according to the selection signal of the pixel 50. The selection transistor 58 and the drive transistor 56 may be shared with neighboring pixels 50, to increase the integration degree of the pixel.

Hereinafter, the operation of the pixel of the image sensor shown in FIG. 1 will be described in detail.

The power voltage VDD may be applied to the first terminal of the reset transistor 54 and the first terminal of the drive transistor 56, respectively, on condition that light is shut off. Thus, the residual charges may be discharged out of the floating diffusion node 60. Then, an external light is guided onto the photodiode 62 on condition that the reset transistor 54 may be turned off, thereby generating a pair of electron holes from the photodiode 62. The hole may be transferred to and stored in a P-type impurity area, and the electron may be transferred to and stored in an N-type impurity area. In such a case, when the transfer transistor 52 may be turned on, the electric charges (e.g., the electron and the hole) may be transferred to and stored at the floating diffusion node 60. A bias voltage of the gate electrode of the drive transistor 56 may be varied according to the stored charges in the floating diffusion node 60, and as a result, the source voltage of the selection transistor 58 may be varied according to the bias voltage of the gate electrode of the drive transistor 56. In such a case, when the selection transistor 58 may be turned on, the electric signal caused by the charges may be detected.

As the integration degree of the image sensor increases, the photoelectric conversion area in which the photodiode may be positioned may also be reduced, and thus the intensity of light detected by the photodiode may also be reduced. However, when the photodiodes are stacked in a vertical direction, the intensity of the detected light may not be reduced at the same photoelectric conversion area. In the present example embodiments, the photodiodes 62 may be stacked in the vertical direction and may be positioned in the recess of the substrate, thereby preventing the intensity reduction of the detected light by the photoelectric conversion device PD. Therefore, the image sensor including the pixel 50 may have an improved full-well capacity and drive range.

Because the gate electrode of the transfer transistor 52 may extend into the recess of the substrate, the electric charges generated from the photodiode 62 may be easily transferred to the floating diffusion node 60.

Hereinafter, the image sensor including the pixel shown in FIG. 1 will be described in detail with reference to FIGS. 2 and 3.

Figure 2:
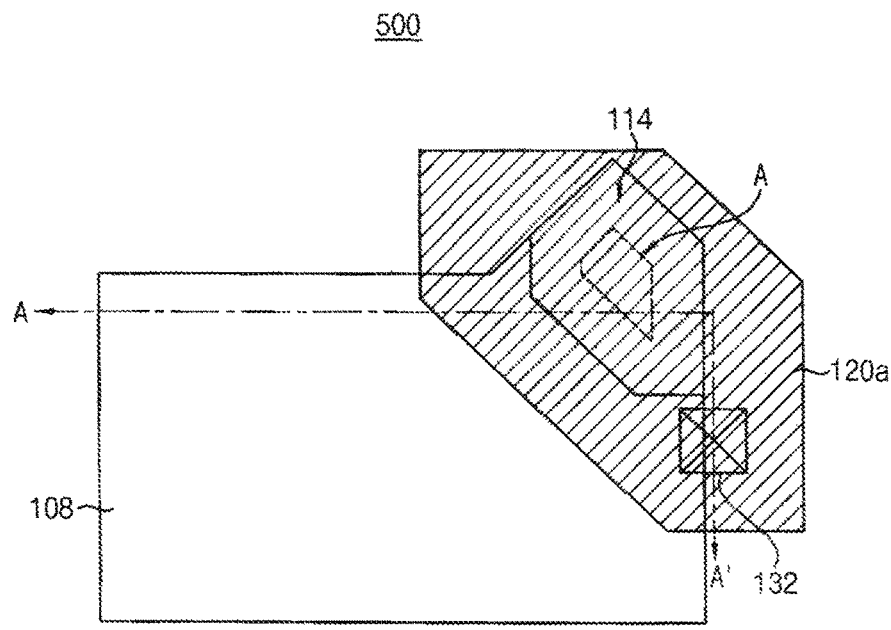
FIG. 2 is a plan view illustrating an image sensor in accordance with example embodiments.
Figure 3:
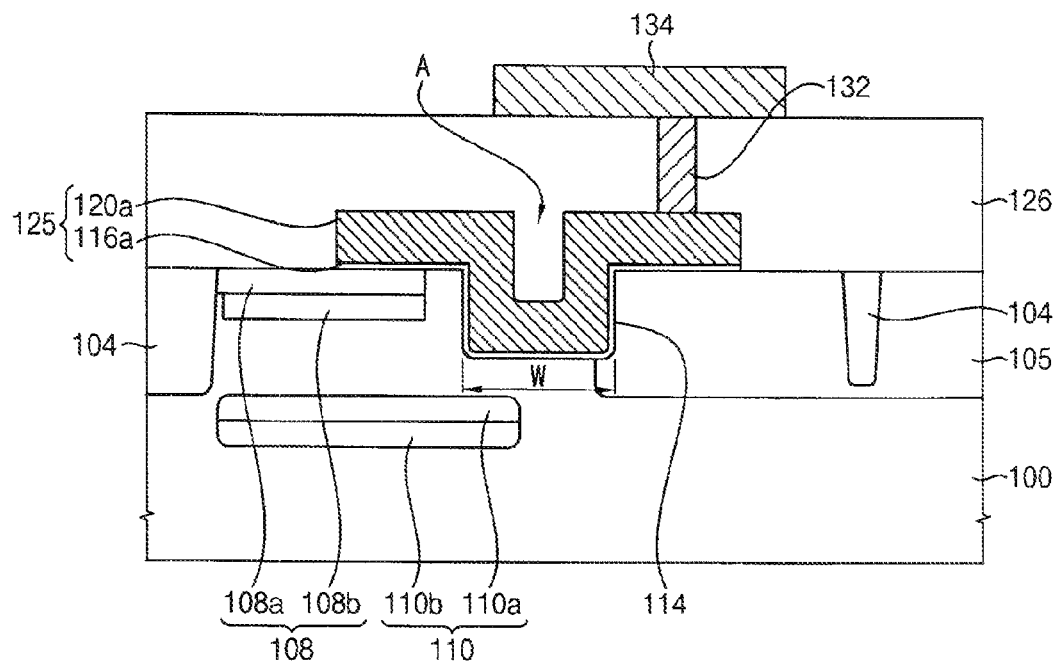
FIG. 3 is a cross-sectional view cut along a line A-A' of FIG. 2.

FIG. 2 is a plan view illustrating an image sensor in accordance with example embodiments, and FIG. 3 is a cross-sectional view cut along a line A-A' of FIG. 2.

Particularly, an active pixel sensor (APS) of the image sensor is disclosed in FIGS. 2 and 3.

Referring to FIGS. 2 and 3, an image sensor 500 in accordance with example embodiments may include a semiconductor substrate 100 (e.g., a P-type semiconductor substrate). A deep well (not illustrated) may be provided below a surface of an active pixel area of the substrate 100 and the P-type impurities may be doped into the deep well at a higher concentration than the substrate 100.

The substrate 100 may include an active region and a device isolation region, and a device isolation pattern 104 may be provided in the device isolation region of the substrate 100. A device isolation impurity area 105 may be provided around the device isolation pattern 104, and the concentration of the P-type impurities of the device isolation impurity area 105 may be higher than the substrate 100.

A photoelectric conversion area in which the photodiodes 108 and 110 may be arranged may be provided on the active region of the substrate 100. A first photodiode 108 and a second photodiode 110 may be vertically stacked below the surface of the photoelectric conversion area of the substrate 100.

The first photodiode 108 may include a first N-type impurity portion 108a and a first P-type impurity portion 108b that may be joined to each other. The first P-type impurity portion 108b may have a doping concentration of the P-type impurities higher than that of the substrate 100. Otherwise, the first P-type impurity portion 108b may have the same doping concentration as the substrate 100 without any additional doped impurities.

The second photodiode 110 may be positioned under the first photodiode 108 and may include a second N-type impurity portion 110a and a second P-type impurity portion 110b that may be joined to each other. The second P-type impurity portion 110b may have a doping concentration of the P-type impurities higher than that of the substrate 100. Otherwise, the second P-type impurity portion 110b may have the same doping concentration as the substrate 100 without any additional doped impurities.

A floating diffusion area may also be provided in the active region of the substrate 100 and spaced apart from the photoelectric conversion area. N-type impurities may be doped into the floating diffusion area.

A gate electrode of the transfer transistor (referred to as transfer gate) may be provided between the floating diffusion area and the photoelectric conversion area in the active region of the substrate 100. A recess 114 may be provided on the substrate 100 corresponding to the transfer gate. A first side wall of the recess 114 may be adjacent to and spaced apart from the photoelectric conversion area and a second side wall opposite to the first side wall of the recess 114 may make contact with the floating diffusion area. A slope of the first and the second sidewalls of the recess 114 may be over about 80°. In the present example embodiments, the first and second sidewalls of the recess 114 may be substantially perpendicular to a bottom thereof. The transfer gate may be arranged in the recess 114 and on the surface of the substrate 100 around the recess 114.

For example, the transfer gate 125 may include a gate insulation pattern 116a and a gate conductive pattern 120a stacked on the gate insulation pattern 116a. The gate conductive pattern 120a may comprise polysilicon doped with impurities. For example, a pure polysilicon layer may be formed on a gate insulation layer and impurities may be doped into the pure polysilicon layer. Therefore, the doped polysilicon layer may be formed on the gate insulation layer. The doped polysilicon layer and the gate insulation layer may be patterned into the gate insulation pattern 116a and the gate conductive pattern 120a, to thereby form the transfer gate 125 on the substrate 100. A scanning electron microscope (SEM) image generally discloses that no grains are found in the doped polysilicon when the doped polysilicon may be formed on the gate insulation layer by an in-situ process, and a plurality of grains are found in the doped polysilicon when the impurities are doped into the pure polysilicon layer. Thus, the grains in the doped polysilicon layer may indicate whether the doping to the polysilicon layer may be formed by in-situ with the formation of the polysilicon layer or by an additional process after the formation of the polysilicon layer.

The transfer gate 125 may be formed on sidewalls and bottom of the recess 114 and on a surface of the substrate 100 around the recess 114 along a surface profile of the substrate 100 including the recess 114. Thus, the transfer gate 125 may include a first portion that may be formed on the sidewalls and bottom of the recess 114 and a second portion that may be formed on the surface of the substrate 100 around the recess 114.

In example embodiments, the first portion of the transfer gate 125 may include a cavity A at a central portion of the recess 114, and the second portion of the transfer gate 125 may have a flat upper surface. Therefore, the transfer gate 125 may include a first upper surface having the cavity A at the central portion of the recess 114, and a second upper surface parallel with the surface of the substrate 100. Thus, a whole upper surface of the transfer gate 125 may be uneven along a whole surface of the substrate 100.

The gate conductive pattern 120a may have a thickness less than a half of the width w of the recess 114. In case that the width w of the recess 114 may not be uniform along a depth of the recess 114, the thickness of the gate conductive pattern 120a may be less than a half of the minimal width w of the recess 114. In addition, the gate conductive pattern 120a may be conformal to the shape of the recess 114 and thus thickness of the gate conductive pattern 120a may be uniform along the surface of the substrate 100 and the sidewalls and bottom of the recess 114. In addition, the impurity may be uniformly doped into the gate conductive pattern 120a, and thus the first and the second portion of the transfer gate 125 may have substantially the same doping concentration.

Therefore, the gate conductive pattern 120a may have a sufficient doping concentration at the bottom of the recess 114, and thus the electrical resistance of the gate conductive pattern 120a may be sufficiently reduced and the electric charges may be sufficiently transferred through the transfer gate 125.

Accordingly, the transfer transistor may include a first channel under the first portion of the transfer gate 125, and a second channel under the second portion of the transfer gate 125. That is, the first channel of the transfer transistor may be provided below the sidewalls and bottom of the recess 114 and the second channel of the transfer transistor may be provided below the surface of the substrate 100 around the recess 114. In such a case, the first channel may be extended as the depth of the recess 114a may increase, and thus the surface size of the first channel of the transfer transistor may be easily enlarged by controlling the depth of the recess 114. As a result, the electric charges may be easily transferred to the floating diffusion area from the first and the second photodiodes 108 and 110.

Although not illustrated in figures, the reset transistor, the drive transistor and the selection transistor may also be provided on the substrate 100.

The reset transistor may be connected to the floating diffusion area and may include a reset gate electrode comprising doped polysilicon. The junction areas of the reset gate electrode may be connected to the floating diffusion area and the power voltage, respectively.

The driver transistor may include a drive gate electrode comprising doped polysilicon. The drive gate electrode may be electrically connected to the floating diffusion area through a contact plug and a wiring. One of the junction areas of the drive gate electrode may be connected to the power voltage.

The selection transistor may be electrically connected to the other junction area of the drive gate electrode, and may include a selection gate electrode comprising doped polysilicon.

An insulation interlayer 126 may be formed on the substrate 100 and thus the transfer transistor, the reset transistor, the drive transistor, the selection transistor, the photoelectric conversion area and the floating diffusion area may be covered with the insulation interlayer 126. For example, the insulation interlayer 126 may comprise an insulation material (e.g., a silicon oxide).

A plurality of contact plugs may be provided through the insulation interlayer 126 and may make contact with the gate electrode and junction areas of the above transistors.

For example, a transfer contact plug 132 may make contact with the gate conductive pattern 120a of the transfer gate 125 through the insulation interlayer 126. Particularly, the transfer contact plug 132 may make contact with the second portion of the transfer gate 125 that may be positioned on the surface of the substrate 100 around the recess 114. That is, the transfer contact plug 132 may be deviated from the cavity A of the first portion of the transfer gate 125 and may be positioned on the flat surface of the second portion of the transfer gate 125. That is, the transfer contact plug 132 may be positioned on the gate conductive pattern 120a aside from the central portion of the recess 114. For example, the transfer contact plug 132 may include a barrier metal layer and a metal layer enclosed by the barrier metal layer.

A wiring 134 may be arranged on the insulation interlayer 126 and may be connected to the transfer contact plug 132. The wiring 134 may also include a barrier metal layer and a low-resistive metal layer enclosed by the barrier metal layer.

Although not illustrated in the figures, a plurality of contact plugs may be provided on the insulation interlayer 126 and may be connected to the gate electrodes and the junction areas of the reset transistor, the drive transistor and the selection transistor, respectively. In addition, a plurality of supplementary contact plugs may be provided on the insulation interlayer 126 and may be connected to a power terminal of the drive transistor and an output terminal of the selection transistor, respectively.

Hereinafter, the generation and transfer of the electric charges in the image sensor shown in FIG. 3 will be described in detail.

When a light may be incident onto the photoelectric conversion area of the substrate 100, most of the light may reach the surface of the substrate 100 and some of the light may pass through the substrate 100. For example, when a blue light having a wavelength of about 470 nm may be incident onto the photoelectric conversion area, most of the blue light may reach the first photodiode 108 that may be positioned at surface portions of the substrate 100. Further, some of the blue radiation may still pass through the substrate 100 and thus may reach the second photodiode 110 that may be positioned under the first photodiode 108 in the substrate 100. Thus, most of the electric charges may be generated from the first photodiode 108 and some of the electric charges may be additionally generated from the second photodiode 110. Therefore, the vertical stack arrangement of the first and the second photodiodes 108 and 110 may increase the number of the electric charges stimulated by the light.

The electric charges generated from the first and the second photodiodes 108 and 100 may be transferred to the floating diffusion area through the channel of the transfer transistor. Because the transfer gate of the transfer transistor may be recessed at the recess 114 of the substrate 100, the channel of the transfer transistor may include the first channel along the surface of the substrate 100 and the second channel along the sidewalls and bottom of the recess 114.

Therefore, the electric charges generated from the first photodiode 108 may be transferred to the floating diffusion area through the first and the second channels of the transfer transistor, and the electric charges generated from the second photodiode 110 may be transferred to the floating diffusion area through the second channel of the transfer transistor.

In the conventional vertical-shaped transfer transistor, no cavity may be provided at an upper surface of the transfer gate and thus the upper surface of the transfer gate may be flat. As a result, the first portion of the gate conductive layer may have a thickness greater than that of the second portion of the gate conductive layer and the doping concentration of the impurities may be much smaller at the first portion than at the second portion of the gate conductive layer. At worst, no impurities may be doped into a lower portion of the first portion of the gate conductive layer. Further, as the depth of the recess of the substrate increases, the doping concentration of the impurities may become smaller and smaller in the lower portion of the first portion of the gate conductive layer. When the first portion of the gate conductive layer may be insufficiently doped with impurities, the electrical resistance of the transfer gate may be excessively increased, and it may be difficult for the transfer transistor including the transfer gate to function as a switching element. In addition, the first channel may not be provided under the sidewalls and bottom of the recess, electric charges may be difficult to transfer to the floating diffusion area, which may lead to an operation defect of the image sensor (e.g., an image lag).

However, in the above disclosed vertical-shaped transfer transistor, the cavity A may be provided on the upper surface of the transfer gate 125 at the central portion of the recess 114, the transfer gate 125 may extend along the surface profile of the substrate 100 including the recess 114 and thus may have a uniform thickness along the upper surface of the substrate 100 and the sidewalls and bottom of the recess 114. As a result, the impurities may be easily doped into the lower portion of the first portion of the transfer gate 125, to thereby facilitate the control of the doping concentration at the first portion of the transfer gate 125. The electric charges generated from the first and the second photodiodes 108 and 110 may be sufficiently well transferred to the floating diffusion area and thus the transfer transistor including the transfer gate 125 may sufficiently function as a switching element. Particularly, the electric charges generated from the second photodiode 110 may be rapidly transferred to the floating diffusion area through the second channel, to thereby preventing the image defects such as the image lag.

FIGS. 4A to 4G are cross-sectional views illustrating processing steps for a method of manufacturing the image sensor shown in FIGS. 2 and 3. FIGS. 5A to 5D are plan views illustrating processing steps for a method of manufacturing the image sensor shown in FIGS. 2 and 3.

Figure 4A:
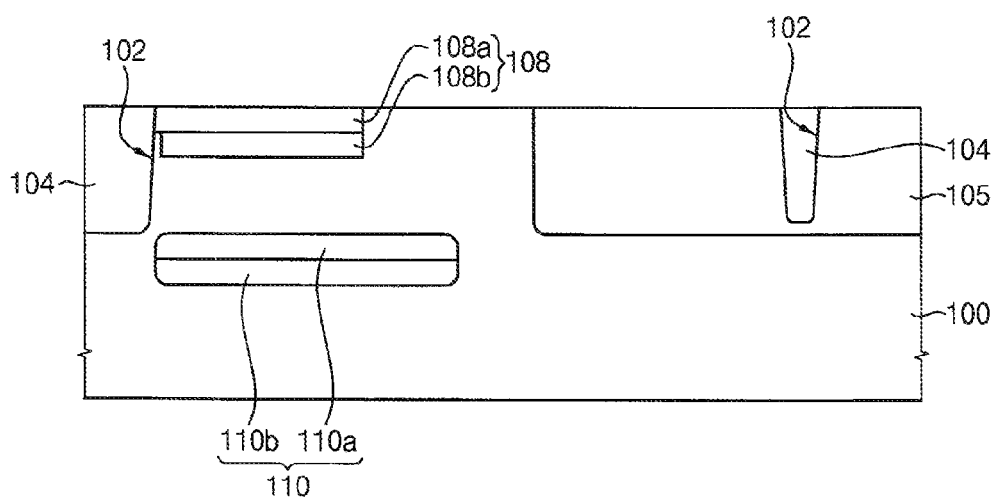
FIGS. 4A to 4G are cross-sectional views illustrating processing steps for a method of manufacturing the image sensor shown in FIGS. 2 and 3.
Figure 5A:
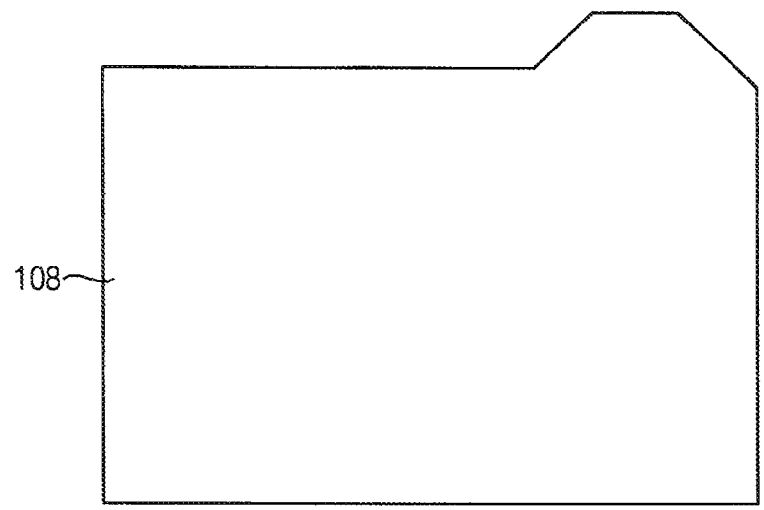
FIGS. 5A to 5D are plan views illustrating processing steps for a method of manufacturing the image sensor shown in FIGS. 2 and 3.

Referring to FIGS. 4A and 5A, a semiconductor substrate 100 may be provided, and P-type impurities may be doped into the substrate 100. A deep well may be formed on the substrate 100. The pixels of the image sensor 500 may be arranged on the deep well area of the substrate 100. The P-type impurities may be more heavily doped into the deep well, and thus the doping concentration of the deep well may be higher than the substrate 100. A device isolation pattern 104 may be formed in the substrate 100 and thus an active region may be defined by the device isolation pattern 104. For example, the device isolation pattern 104 may be shallow trench isolation (STI) process. A shallow trench 102 may be formed on the substrate 100 and the trench 102 may be filled with insulation materials. The insulation materials in the trench 102 may be formed into the device isolation pattern 104. Further, impurities may be doped into the substrate 100 around the device isolation pattern 104, thereby forming the device isolation impurity area 105 around the device isolation pattern 104.

A plurality of photodiodes may be formed inside of the substrate 100 at the active region in such a configuration that the photodiodes may be vertically stacked along a direction of the thickness of the substrate 100. For example, the photodiodes may be formed by repeating a number of ion implantation processes using a respective ion implantation mask. In the present example embodiments, a pair of first and second photodiodes 108 and 110 may be formed in the substrate 100. The first photodiode 108 may be formed at surface portions of the substrate 100 and the second photodiode 110 may be formed under the first photodiode 108. N-type impurities may be doped onto the surface portion of the substrate 100 by an ion implantation process, to thereby form a first N-type impurity area 108a at the surface portion of the substrate 100. Then P-type impurities may be doped into the substrate 100 deeper than the first N-type impurity area 108a by the ion implantation process, to thereby form a first P-type impurity area 108b under the first N-type impurity area 108a. The first N-type impurity area 108a and the first P-type impurity area 108b may be joined with each other, to thereby form a P-N junction as the first photodiode 108. Thereafter, the same P-type impurities may be doped into the substrate 100 much deeper than the first P-type impurity area 108b by the ion implantation process, to thereby form a second P-type impurity area 110a vertically spaced apart from the first P-type impurity area 108b. N-type impurities may be doped into the substrate 100 deeper than the second P-type impurity area 110a by an ion implantation process, to thereby form a second N-type impurity area 110b. The second P-type impurity area 110a and the second N-type impurity area 110b may be joined with each other, to thereby form an N-P junction as the second photodiode 110.

Thereafter, P-type impurities may be implanted onto a channel area of the transfer transistor by an ion implantation process, to thereby form a channel impurity area on the substrate 100.

Figure 4B:
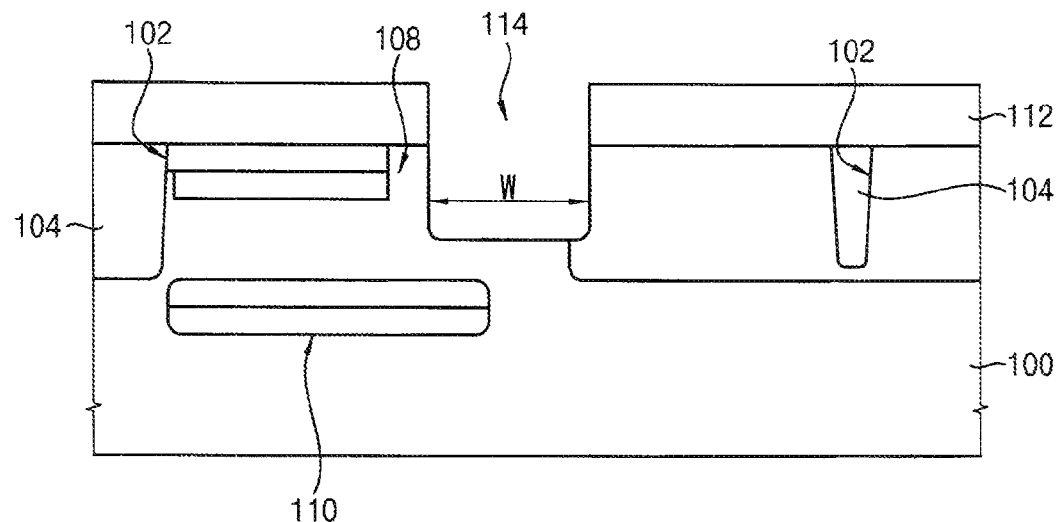
Figure 5B:
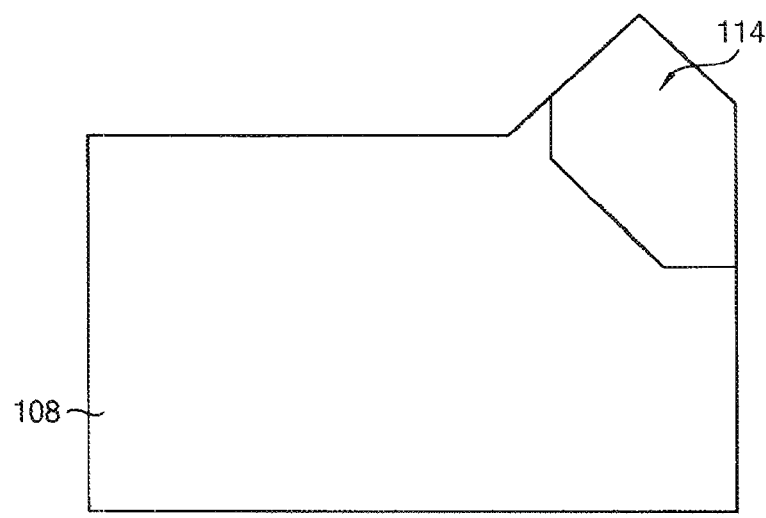

Referring to FIGS. 4B and 5B, a first mask pattern 112 may be formed on the substrate 100 in such a way that a portion of the substrate 100 may be exposed through an opening of the first mask pattern 112. Then, the substrate 100 exposed through the opening may be partially etched off by an anisotropic etching process using the first mask pattern 112 as an etching mask, thereby forming a recess 114 on the substrate 100 corresponding to the opening. Particularly, the bottom of the recess 114 may be spaced apart from the first and the second photodiodes 108 and 110 and the sidewalls of the recess 114 may be substantially perpendicular to the bottom surface of the recess 114. Thereafter, the first mask pattern 112 may be removed from the substrate 100.

Figure 4C:
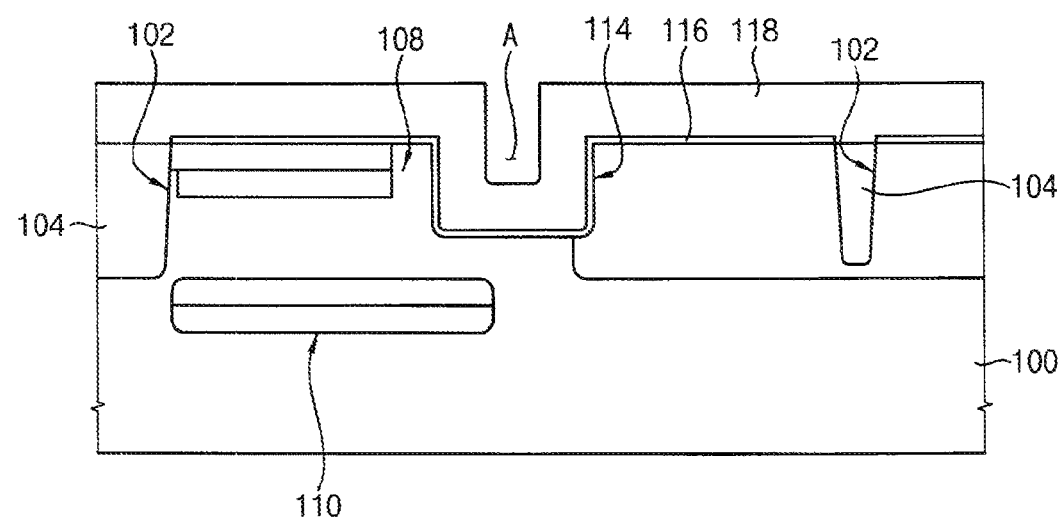

Referring to FIG. 4C, a gate insulation layer 116 may be formed on a surface of the substrate and the sidewalls and the bottom of the recess 114 by a thermal oxidation process. Thus, the gate insulation layer 116 may be formed on the substrate 100 with being conformal to a surface profile of the substrate 100 including the recess 114.

A pure polysilicon layer 118 may be formed on the gate insulation layer 116 conformal to the surface profile of the substrate 100 including the recess 114, and thus a pure polysilicon layer 118 may be formed along the surface of the substrate 100 and the sidewalls and the bottom of the recess 114. Hereinafter, the pure polysilicon layer refers to a polysilicon layer into which no impurities are implanted.

Particularly, the pure polysilicon layer 118 may be formed to have a cavity A at the central portion of the recess 114 because the pure polysilicon layer 118 may be formed conformal to the surface profile of the substrate 100 and thus may have the same thickness from the sidewall and the bottom of the recess 114. In the present example embodiments, the thickness of the pure polysilicon layer 118 from the surface of the substrate 100 may be substantially identical to that of the pure polysilicon layer 118 from the sidewall and the bottom of the recess 114, and thus the thickness of the pure polysilicon layer 118 may be less than about half of the width w of the recess 114.

Figure 4D:
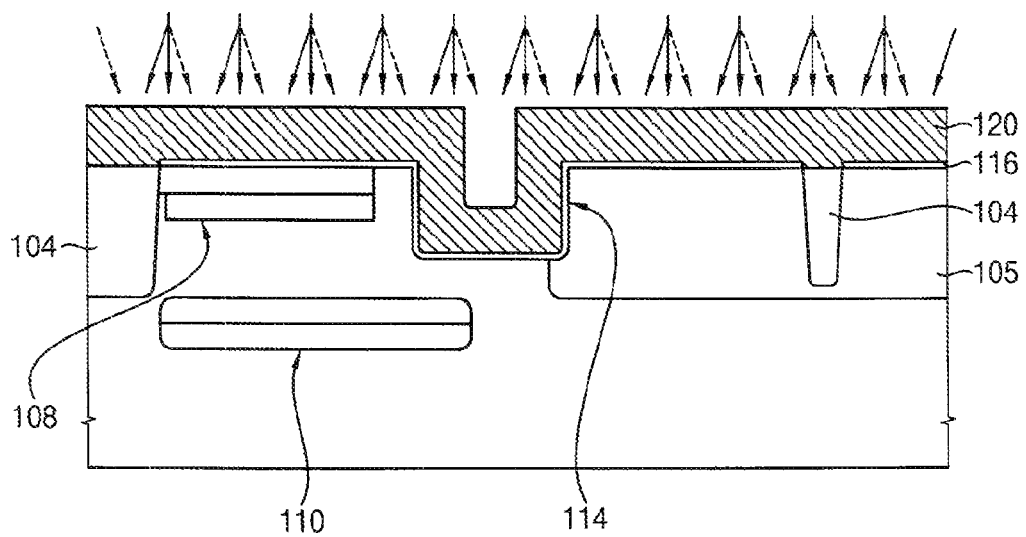

Referring to FIG. 4D, impurities may be implanted into the pure polysilicon layer 118 by an ion implantation process, thereby forming a doped polysilicon layer 120 on the substrate 100. For example, N-type impurities may be doped into the pure polysilicon layer 118.

The impurities may be implanted onto the pure polysilicon layer 118 in a vertical line perpendicular to the surface of the substrate 100. Otherwise, the impurities may also be implanted onto the pure polysilicon layer 118 at a slant angle with respect to the surface of the substrate 100 from the vertical line.

For example, the impurities may be implanted onto the upper surface of the pure polysilicon layer 118 perpendicularly to the surface of the substrate 100 by a first ion implantation process. Then, the impurities may be again implanted onto the upper surface of the pure polysilicon layer 118 at a first slant angle with respect to surface of the substrate 100 by a second ion implantation process and once more again implanted at a second angle with respect to the surface of the substrate 100 by a third ion implantation process. The first and the second slant angles may be measured counterclockwise and clockwise from the vertical line perpendicular to the surface of substrate 100.

Otherwise, the impurities may be implanted onto the upper surface of the pure polysilicon layer 118 at the first and the second slant angles by first and second ion implantation processes, respectively, without implantation perpendicular to the upper surface.

Accordingly, the impurities may be uniformly implanted into the pure polysilicon layer 118 regardless of the surface profile of the substrate 100, and thus the doping concentration of the impurities may be uniform on the surface of the substrate and on the sidewalls and bottom of the recess 114.

Although the upper surface of the pure polysilicon layer 118 may be recessed at the central portion of the recess 114 according to the shape of cavity A, the pure polysilicon layer 118 may have substantially the same doping concentration regardless of the cavity A due to the tilting ion implantation process. That is, the pure polysilicon layer 118 in the recess 114 may be doped with the impurities at the same doping concentration as that of the pure polysilicon layer 118 on the surface of the substrate 100.

In other example embodiments, the pure polysilicon layer 118 may be selectively doped with impurities by modifying an ion implantation mask. For example, N-type impurities may be implanted into a first portion of the pure polysilicon layer 118 and P-type impurities may be implanted into a second portion of the pure polysilicon layer 118. As a result, the pure polysilicon layer 118 may be formed into a doped polysilicon layer 120 by the ion implantation process.

Particularly, the doping impurities into the pure polysilicon layer 118 may be performed by an additional process rather than an in-situ process simultaneously with the formation of the pure polysilicon layer 118. In such a case of the in-situ process, the doped polysilicon layer may have just merely one electrical polarity because only one of the P-type impurities and the N-type impurities can be doped into the polysilicon layer. Thus, the doped polysilicon layer 120 may not have the complementary polarity through the in-situ process, and the single polarity doped polysilicon layer may not be proper for a transistor of a CMOS image sensor.

Because no grains may be found in the doped polysilicon layer that may be formed in-situ with the pure polysilicon layer 118, the grain in the doped polysilicon layer 120 may indicate whether the doped polysilicon layer 120 may be formed by the in-situ process or an additional doping process.

Figure 4E:
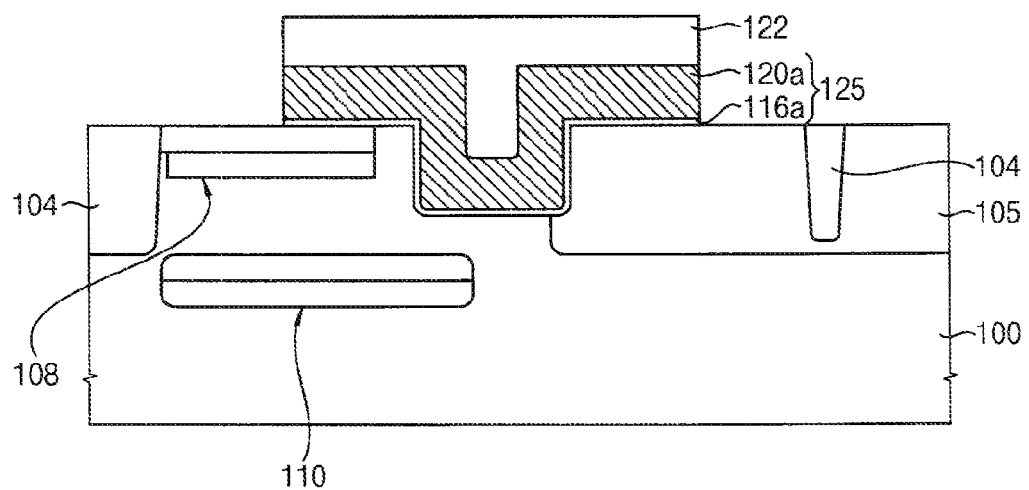
Figure 5C:
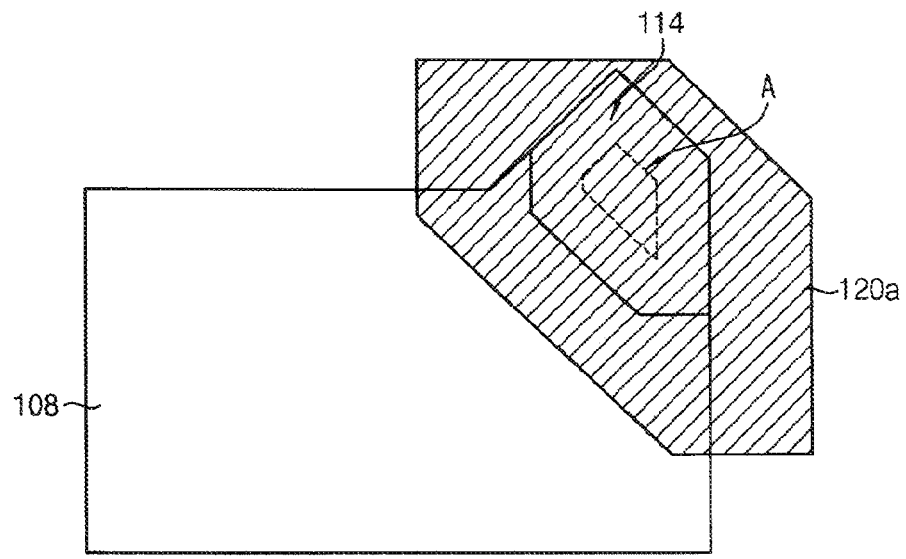

Referring to FIGS. 4E and 5C, a photoresist layer may be formed on the doped polysilicon layer 120, and then may be patterned by a photolithography process, thereby forming a photoresist pattern 122 on the doped polysilicon layer 120. Then, the doped polysilicon layer 120 and the gate insulation layer 116 may be patterned into the gate conductive pattern 120a and the gate insulation pattern 116a, respectively, by an etching process using the photoresist pattern 122 as an etching mask, to thereby form the transfer gate 125 in the recess 114 and on the surface of the substrate 100 around the recess 114.

The transfer gate 125 may include a first portion making contact with the sidewalls and bottom of the recess 114, and a second portion making contact with the surface of the substrate 100 around the recess 114. Particularly, the second portion of the transfer gate 125 may have a sufficient surface area for making contact with at least one contact plug thereon.

In the same way, a plurality of gate electrodes (not illustrated) for the reset transistor, the drive transistor and the selection transistor may be formed on the substrate 100, respectively.

Thereafter, the photoresist pattern 122 may be removed from the transfer gate 125. Then, the floating diffusion area may be formed on the substrate 100, although not illustrated in figures.

Figure 4F:
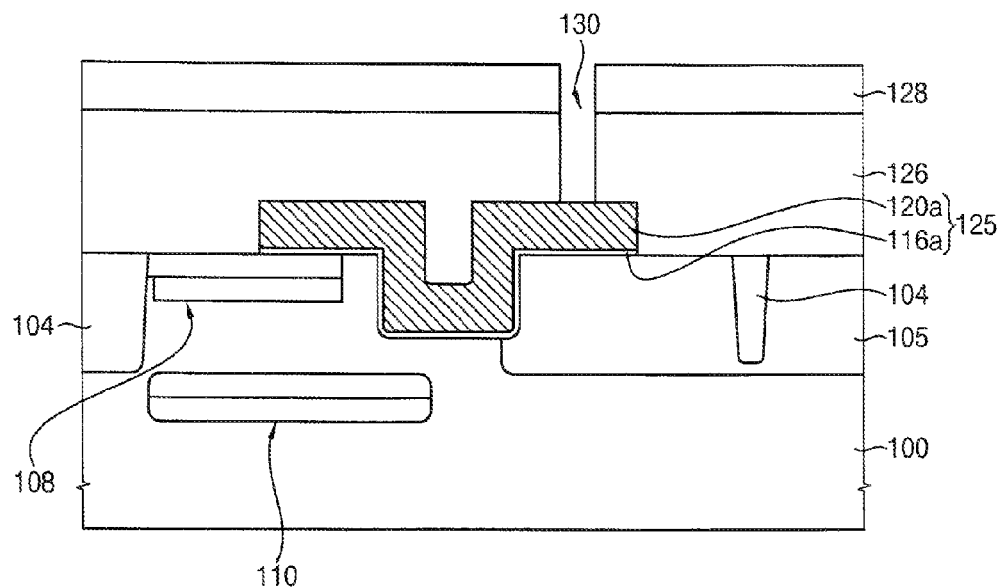

Referring to FIG. 4F, an insulation interlayer 126 may be formed on the substrate 100 in such a way that the transfer transistor, the reset transistor, the drive transistor, the selection transistor, the photoelectric conversion area and the floating diffusion area may be covered with the insulation interlayer 126. For example, the insulation interlayer 126 may comprise an insulation material (e.g., silicon oxide).

Then, a second mask pattern 128 (e.g., a photoresist pattern) may be formed on the insulation interlayer 126 and the insulation interlayer 126 may be partially etched off by an etching process using the second mask pattern 128 as an etching mask, thereby forming a contact hole 130 through which the second portion of the transfer gate 125 may be exposed. Thus, the contact hole 130 may be deviated from the central portion of the transfer gate 125 and the peripheral portion of the transfer gate 125 may be exposed through the contact hole 130.

Although not illustrated in figures, a plurality of other contact holes may be formed through the insulation interlayer 126 in the same way, and thus the junction areas of the reset transistor, the drive transistor and the selection transistor may also be exposed through the other contact holes, respectively.

Thereafter, the second mask pattern 128 may be removed from the insulation interlayer 126 by an ashing process or a stripping process.

Figure 4G:
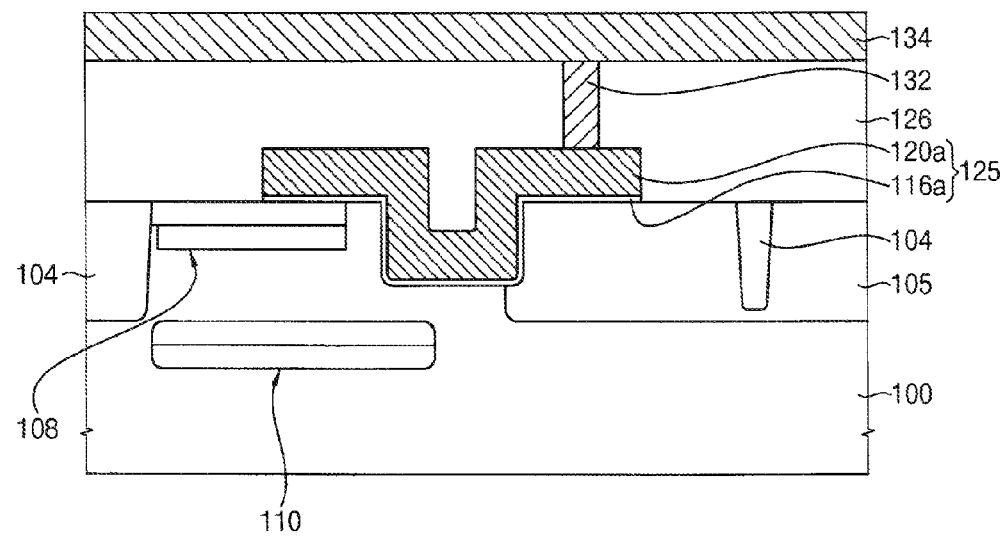
Figure 5D:
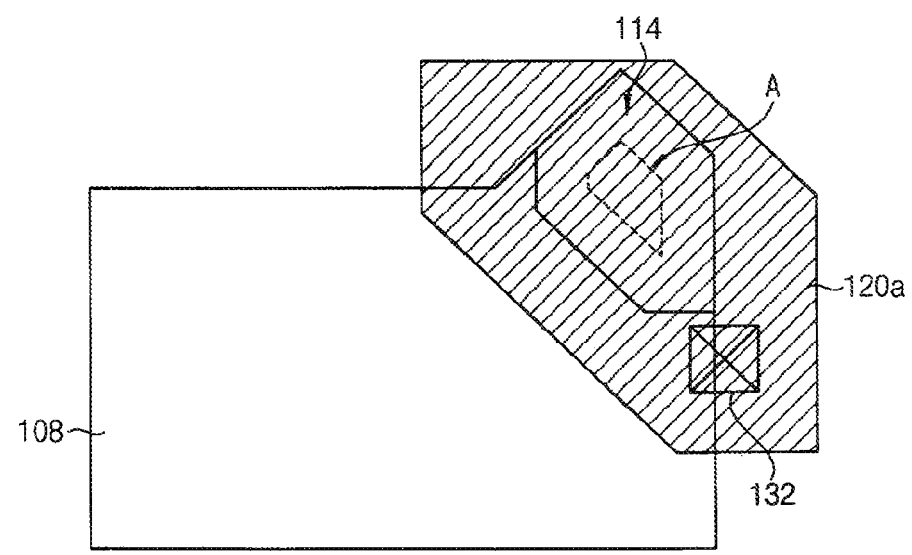

Referring to FIGS. 4G and 5D, a transfer contact plug 132 may be formed in the contact hole 130 in such a configuration that the transfer contact plug 132 may make contact with the second portion of the transfer gate 125.

For example, a conductive layer may be formed on the insulation interlayer 126 to a sufficient thickness to fill up the contact hole 130, and the conductive layer may be planarized by a planarization process (e.g., a chemical mechanical polishing (CMP) process), until an upper surface of the insulation interlayer 126 may be exposed. Thus, the conductive layer may just merely remain in the contact hole 130, to thereby form the transfer contact plug 132 in the contact hole 130.

The conductive layer may comprise a low resistive metal be formed into a bi-layer structure including a barrier metal layer and a metal layer enclosed by the barrier metal layer. The barrier metal layer may include at least one of a titanium layer, a titanium nitride layer, a tantalum layer and a tantalum nitride layer and the metal layer may include at least one of a tungsten layer and a tungsten silicide layer.

Accordingly, the contact plug 132 may make contact with the second portion of the transfer gate 125 spaced apart from the cavity A of the first portion of the transfer gate 125. That is, the contact plug 132 may be positioned at the peripheral portion of the transfer gate 125 rather than at the central portion of the transfer gate 125.

Thereafter, a wiring line 134 may be formed on the insulation interlayer 126 in such a configuration that the contact plug 132 may make contact with the wiring line 134.

Figure 6:
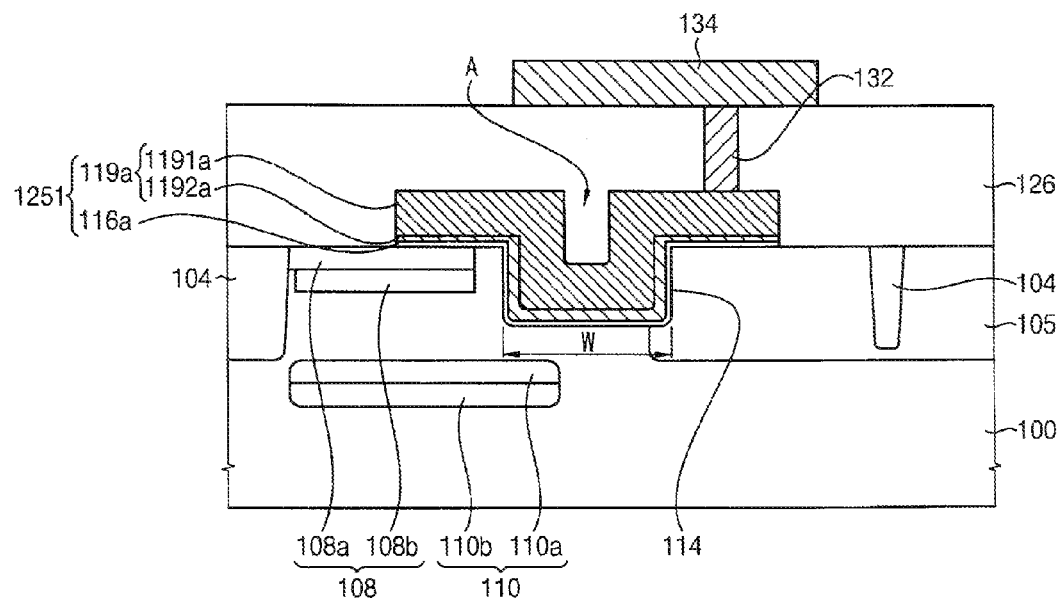
FIG. 6 is a cross-sectional view illustrating an image sensor in accordance with other example embodiments.

FIG. 6 is a cross-sectional view illustrating an image sensor in accordance with other example embodiments.

The image sensor shown in FIG. 6 may have substantially the same structure as the image sensor shown in FIG. 3 except for the transfer gate, and thus in FIG. 6, the same reference numeral denotes the same element in FIG. 3. Thus, the image sensor will be described around the first modified transfer gate without any further descriptions on the same elements.

Referring to FIG. 6, an image sensor 600 in accordance with other example embodiments may include a first modified transfer gate 1251 having the gate insulation pattern 116a and a gate conductive pattern 119a having a first gate conductive pattern 1191a and a second gate conductive pattern 1192a.

The first modified transfer gate 1251 of the image sensor 600 may be arranged along a surface profile of the substrate 100 including the recess 114, and thus may be positioned in the recess 114 and on the surface of the substrate 100 around the recess 114 in such a configuration that the cavity A may be provided on an upper surface of the transfer gate 1251 corresponding to the central portion of the recess 114. Thus, the gate insulation pattern 116a and the first and the second gate conductive patterns 1191a and 1192a may have a uniform thickness along the surface profile of the substrate 100 including the recess 114.

The first and the second gate conductive patterns 1191a and 1192a may comprise polysilicon doped with impurities. The second gate conductive pattern 1192a may be positioned on the gate insulation pattern 116a and the first gate conductive pattern 1191a may be positioned on the second gate conductive pattern 1192a, to thereby constitute the first modified transfer gate 1251 of the image sensor 600.

The first gate conductive pattern 1191a may have a first thickness and a first doping concentration, and the second gate conductive pattern 1192a may have a second thickness smaller than the first thickness and a second doping concentration lower than the first doping concentration. In the present example embodiments, the second thickness of the second gate conductive pattern 1192a may be less than about 30% of a thickness of the gate conductive pattern 119a.

The second gate conductive pattern 1192a having a relatively lower doping concentration and a relatively smaller thickness may be interposed between the gate insulation pattern 116a and the first gate conductive pattern 1191a, which may improve operation characteristics of the transfer transistor in the image sensor 600.

Figure 7:
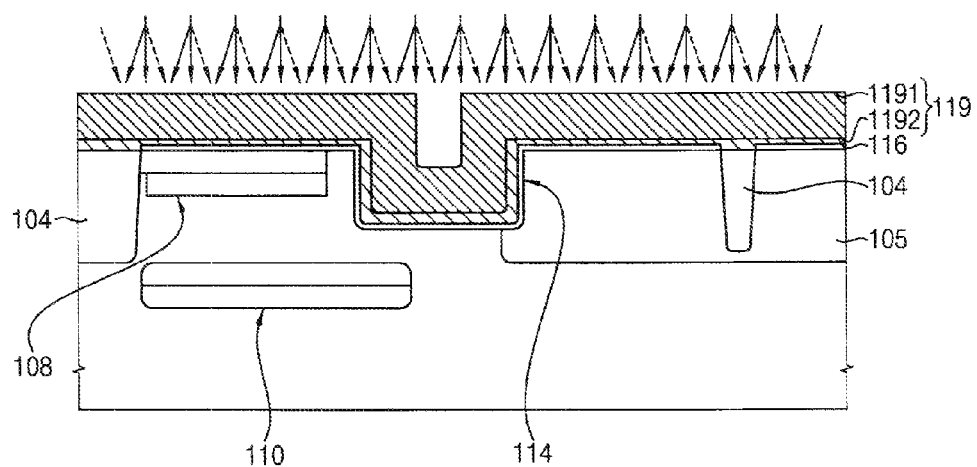
FIG. 7 is a cross-sectional view illustrating a processing step for a method of manufacturing the image sensor shown in FIG. 6.

FIG. 7 is a cross-sectional view illustrating a processing step for a method of manufacturing the image sensor shown in FIG. 6.

The processing steps for manufacturing the image sensor in FIG. 6 may be substantially the same as those for manufacturing the image sensor described in detail with reference to FIGS. 4A to 4G, except for the step for forming the first modified transfer gate 1251. Thus, the processing steps for manufacturing the image sensor shown in FIG. 6 will be described around the step for forming the first modified transfer gate 1251 without any further descriptions on the same processing steps.

The same structure including the pure polysilicon layer 118 as described with reference to FIG. 4C may be formed through the same processes as described with reference to FIGS. 4A to 4C.

Thereafter, impurities may be implanted into the pure polysilicon layer 118 by an ion implantation process as illustrated in FIG. 7. In such a case, the implantation process may be controlled in such a way that the impurities may be implanted into an upper portion of the pure polysilicon layer 118 by a first doping concentration and implanted into a lower portion of the pure polysilicon layer 118 by a second doping concentration lower than the first doping concentration. Thus, the pure polysilicon layer 118 may be transformed into the doped polysilicon layer 119 including a first doped polysilicon layer 1191 and a second doped polysilicon layer 1192 under the first doped polysilicon layer 1191.

For example, the second doped polysilicon layer 1192 may be formed to have a thickness less than about 30% of a thickness of the doped polysilicon layer 119 by controlling the implantation conditions.

Thereafter, the gate insulation layer 116 and the doped polysilicon layer 119 may be patterned into the gate insulation pattern 116a and the gate conductive pattern 119a having the first and the second gate conductive pattern 1191a and 1192a by the same process as described with reference to FIG. 4E. The stack of the gate conductive pattern 119a on the gate insulation pattern 116a may constitute the first modified transfer gate 1251 of the transfer transistor in the image sensor 600.

According to the method of manufacturing the image sensor, because the second gate conductive pattern 1192a may be formed to a sufficiently small thickness, the amount of the impurities may be minimized without the operation characteristics of the transfer gate.

Thereafter, the same process as described with reference to FIGS. 4F to 4G may be further performed to the structure shown in FIG. 7, to thereby form the image sensor shown in FIG. 6.

Figure 8:
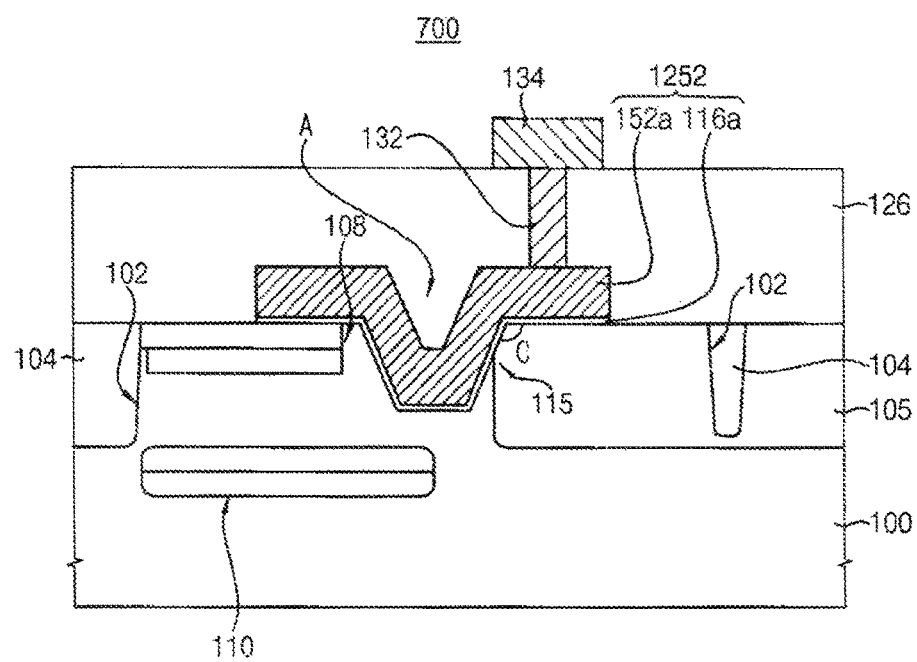
FIG. 8 is a cross-sectional view illustrating an image sensor in accordance with still other example embodiments.

FIG. 8 is a cross-sectional view illustrating an image sensor in accordance with still other example embodiments.

The image sensor shown in FIG. 8 may have substantially the same structure as the image sensor shown in FIG. 3 except for the transfer gate, and thus in FIG. 8, the same reference numeral denotes the same element in FIG. 3. Thus, the image sensor shown in FIG. 8 will be described around the second modified transfer gate without any further descriptions on the same elements.

Referring to FIG. 8, an image sensor 700 in accordance with still other example embodiments may include a second modified transfer gate 1252 having the gate insulation pattern 116a and a tapered gate conductive pattern 152a. A semiconductor substrate 100 may be provided and the device isolation region and an active region may be defined on the substrate 100. The first and the second photodiodes 108 and 110 may be formed into the substrate of the active region and the floating diffusion area may be prepared on the substrate 100. The first and the second photodiodes 108 and 110 may be arranged in a vertical direction inside of the substrate 100. The portion of the substrate 100 at which the first and the second photodiodes 108 and 110 may be arranged may be called as a photoelectric conversion area.

A tapered recess 115 may be provided on the substrate 100 corresponding to the second modified transfer gate 1252 in such a configuration that a top portion of the recess 115 may be larger than a bottom portion of the recess 115. Thus, the sidewall of the recess 115 may have a lower slope than the vertical sidewall of the recess 114 such that a corner angle C of the substrate 100 around the recess 115, which may be defined as an angle between the sidewall of the recess 115 and the surface of the substrate 100, may be greater than 90°. When the corner angle C of the substrate 100 is smaller than about 90°, it may be difficult for the transfer gate 1252 to be formed so as to be conformal to the surface profile of the substrate 100 including the recess 115, while if corner angle C is larger than about 140°, it may be difficult for the transfer gate 1252 to be formed into a vertical shape because the horizontal component of the sidewall of the recess 115 may be excessively increased. For those reasons, the corner angle C of the substrate 100 around the recess 115 may be in a range of about 90° to about 140°.

The second modified transfer gate 1252 of the image sensor 700 may be arranged along a surface profile of the substrate 100 including the recess 115, and thus may be positioned in the recess 115 and on the surface of the substrate 100 around the recess 115 in such a configuration that the cavity A may be provided on an upper surface of the second modified transfer gate 1252 corresponding to the central portion of the recess 115. In the present example embodiments, the cavity A may also be shaped into a taper in accordance with the shape of the recess 115. Thus, the second modified transfer gate 1252 may include a first portion making contact with the sidewall and bottom of the recess 115 and a second portion making contact with the surface of the substrate 100.

The cavity A may be provided on the upper surface of the first portion of the transfer gate 1252 and thus the upper surface of the first portion of the transfer gate 1252 may be uneven. In contrast, the upper surface of the second portion of the transfer gate 1252 may be even and flat In addition, the transfer gate 1252 may have uniform thickness and doping concentration regardless of the recess 115, and thus the first and the second portion of the transfer gate 1252 may have substantially the same thickness and doping concentration. That is, the gate conductive pattern 152a of the transfer gate 1252 may have uniform doping concentration regardless of a depth from the upper surface of the transfer gate 1252.

As described in detail with reference to FIGS. 2 and 3, the reset transistor, the drive transistor and the selection transistor may be also provided on the substrate 100.

The insulation interlayer 126 may be provided on the substrate 100 in such a configuration that the transfer gate 1252, the reset transistor, the drive transistor, the selection transistor, the photoelectric conversion area and the floating diffusion area may be covered with and be electrically insulated from one another by the insulation interlayer 126.

The contact plug 132 may penetrate through the insulation interlayer 126 and may make contact with gate electrodes of the above transistors and junction areas and the wiring line 134 may be formed on the insulation interlayer 126 such that the wiring line 134 may make contact with the contact plug 132.

Particularly, the contact plug 132 making contact with the transfer gate 1252 may deviate from the central portion of the transfer gate 1252, and may be positioned on a peripheral portion of the transfer gate 1252. That is, the contact plug 132 may make contact with the second portion of the transfer gate 1252 aside from the cavity A of the first portion of the transfer gate 1252.

Figure 9A:
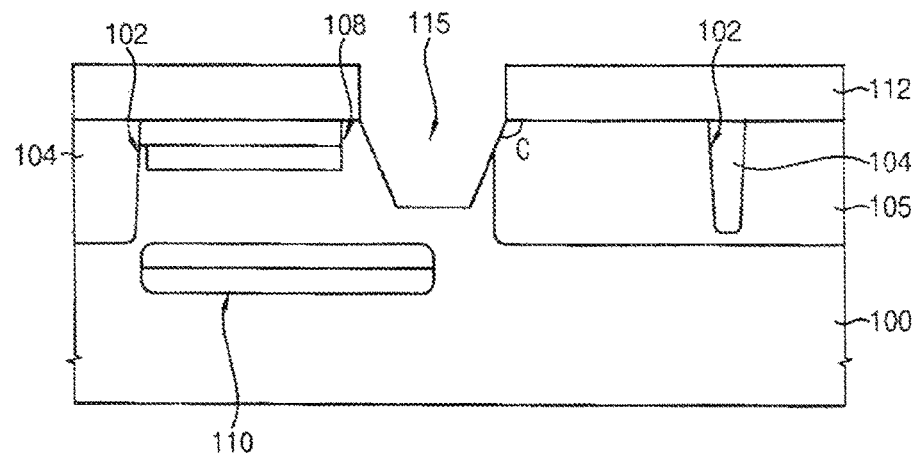
FIGS. 9A to 9C are cross-sectional views illustrating processing steps for a method of manufacturing the image sensor shown in FIG. 8.
Figure 9B:
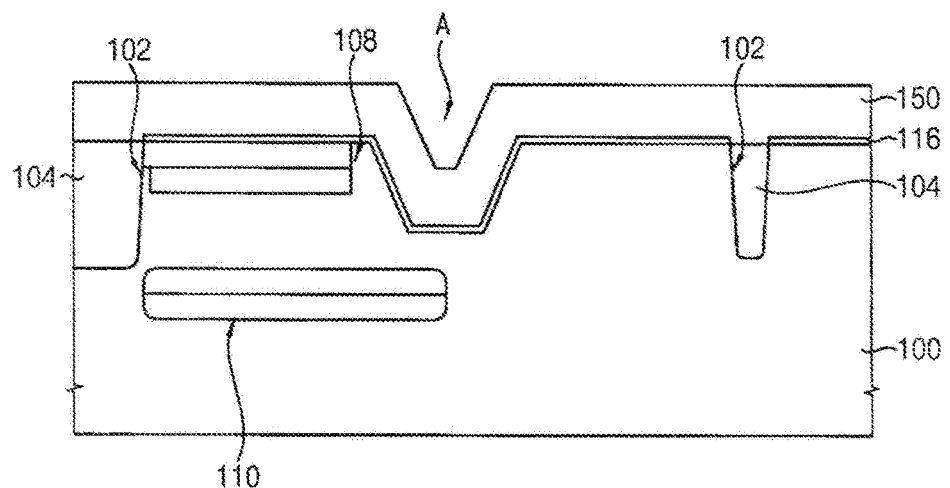
Figure 9C:
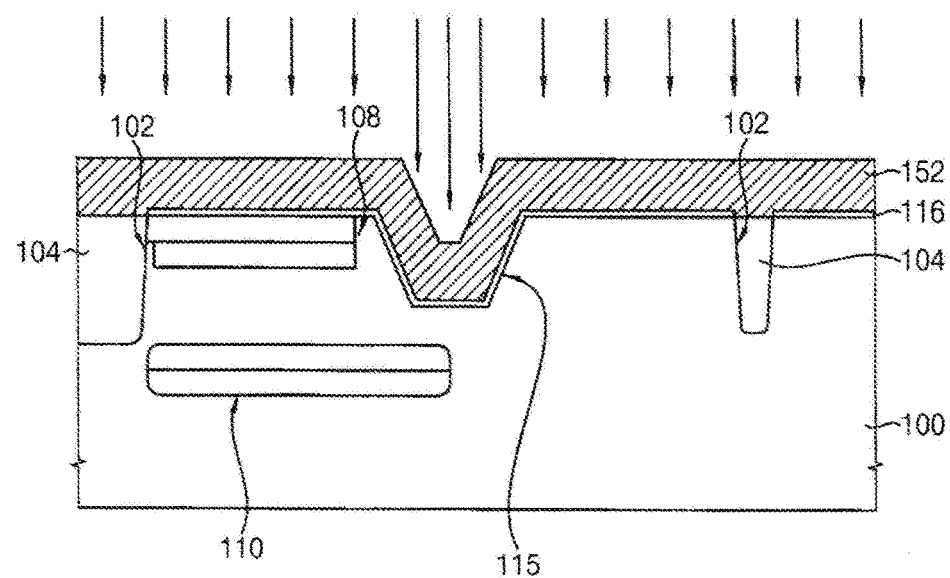

FIGS. 9A to 9C are cross-sectional views illustrating processing steps for a method of manufacturing the image sensor shown in FIG. 8.

The processing steps for manufacturing the image sensor shown in FIG. 8 may be substantially the same as those for manufacturing the image sensor described in detail with reference to FIGS. 4A to 4G, except for the step for forming the recess and the second modified transfer gate. Thus, the processing steps for manufacturing the image sensor shown in FIG. 8 will be described around the step for forming the recess and the step for forming the second modified transfer gate and the other steps substantially the same as those for manufacturing the image sensor described with reference to FIGS. 4A to 4G will be briefly described.

Referring to FIG. 9A, the device isolation pattern 104 may be formed on the substrate 100 to which P-type impurities may be implanted, and thus the active region may be defined on the substrate 100 by the device isolation pattern 104. The first and the second photodiodes 108 and 110 may be formed in the substrate 100 by the same process as described with reference to FIG. 4A. Then, the device isolation impurity area 105 may be formed around the device isolation pattern 104 and a channel impurity area (not illustrated) may be formed on the substrate 100 by the same process as described with reference to FIG. 4A.

Then, the first mask pattern 112 may be formed on the substrate 100 in such a way that a portion of the substrate 100 may be exposed through an opening of the first mask pattern 112. Then, the substrate 100 exposed through the opening may be partially etched off by an anisotropic etching process using the first mask pattern 112 as an etching mask, thereby forming the tapered recess 115 on the substrate 100 corresponding to the opening.

In such a case, the etching process of the substrate 100 may be controlled in such a way that the sidewall of the recess 115 may be at least slightly slanted downwards and thus the bottom portion of the recess 115 may be smaller than the upper portion of the recess 115. For example, the substrate 100 may be etched off such that the corner angle C of the substrate 100 may be in a range of about 90° to about 140°.

Due to the tapered shape of the recess 115, the pure polysilicon may be uniformly doped with impurities without a tilted ion implantation process in a subsequent process. That is, the tapered shape of the recess 115 may eliminate the step of inclined ion implantation of impurities with respect to the upper surface of the pure polysilicon layer.

Referring to FIG. 9B, a gate insulation layer 116 may be formed on a surface of the substrate and the sidewalls and the bottom of the recess 115 by a thermal oxidation process. Thus, the gate insulation layer 116 may be formed on the substrate 100 so as to be conformal to a surface profile of the substrate 100 including the recess 115.

A pure polysilicon layer 150 may be formed on the gate insulation layer 116 conformal to the surface profile of the substrate 100 including the recess 115, and thus the pure polysilicon layer 150 may be formed along the surface of the substrate 100 and the sidewalls and the bottom of the recess 115. In the same way as described with reference to FIG. 4C, the pure polysilicon layer refers to a polysilicon layer into which no impurities are implanted. Particularly, the pure polysilicon layer 150 may be formed to have a cavity A at the central portion of the recess 115, because the pure polysilicon layer 150 may be formed conformal to the surface profile of the substrate 100 and thus may have the same thickness from the sidewall and the bottom of the recess 115. Accordingly, the pure polysilicon layer 150 may have the same slopes at the cavity A in accordance with the sidewalls of the recess 115.

Referring to FIG. 9C, impurities may be implanted into the pure polysilicon layer 150 by an ion implantation process, thereby forming a doped polysilicon layer 152 on the substrate 100. For example, N-type impurities may be doped into the pure polysilicon layer 150.

The impurities may be implanted onto the pure polysilicon layer 150 perpendicularly to the surface of the substrate 100. Because the pure polysilicon layer 152 in the recess 115 may be slanted corresponding to the sidewall of the tapered recess 115, the impurities may be uniformly implanted into the slant surface and a recessed surface of the pure polysilicon layer at the cavity A although the impurities may be implanted perpendicularly to the surface of the substrate 100. Accordingly, the impurities may be uniformly implanted into the pure polysilicon layer 150 regardless of the surface profile of the substrate 100, and thus the doping concentration of the impurities may be uniform on the surface of the substrate 100 and on the sidewalls and bottom of the recess 115.

Thereafter, the gate insulation layer 116 and the doped polysilicon layer 152 may be patterned into the gate insulation pattern 116a and the gate conductive pattern 152a by the same process as described with reference to FIG. 4E. The stack of the gate conductive pattern 152a on the gate insulation pattern 116a may constitute the second modified transfer gate 1252 of the transfer transistor in the image sensor 700.

Thereafter, the same process as described with reference to FIGS. 4F to 4G may be further performed, to thereby form the image sensor 700 shown in FIG. 8.

Figure 10:
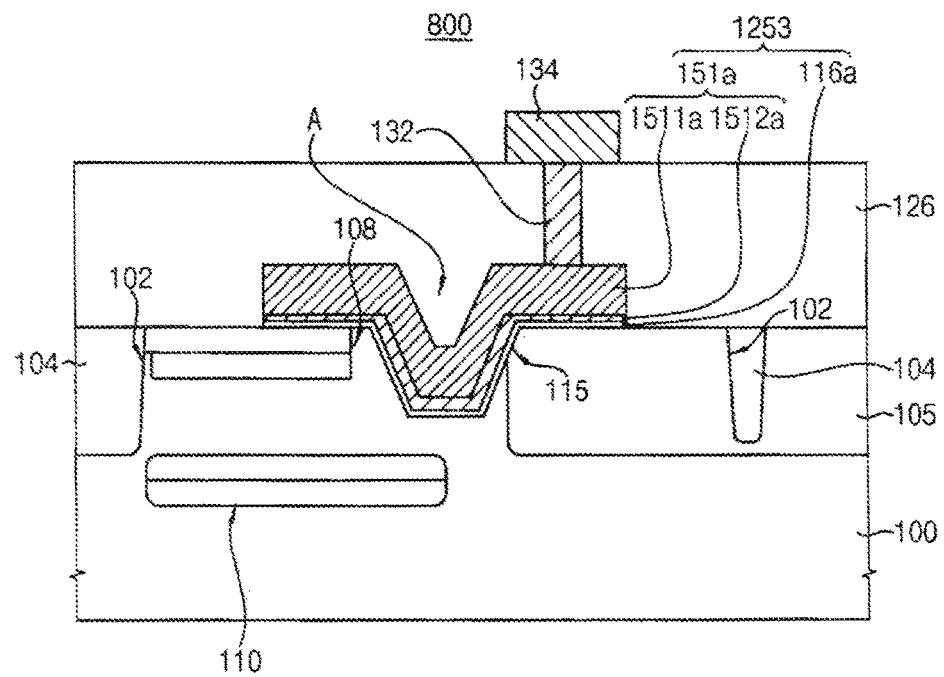
FIG. 10 is a cross-sectional view illustrating an image sensor in accordance with still yet other example embodiments.

FIG. 10 is a cross-sectional view illustrating an image sensor in accordance with still other example embodiments.

The image sensor shown in FIG. 10 may have substantially the same structure as the image sensor shown in FIG. 8 except the transfer gate, and thus in FIG. 10, the same reference numeral denotes the same element in FIG. 8. Thus, the image sensor shown in FIG. 10 will be described around the third modified transfer gate without any further descriptions on the same elements.

Referring to FIG. 10, an image sensor 800 in accordance with other example embodiments may include a third modified transfer gate 1253 having the gate insulation pattern 116a and a gate conductive pattern 151a having a first gate conductive pattern 1511a and a second gate conductive pattern 1512a.

The third modified transfer gate 1253 of the image sensor 800 may be arranged along a surface profile of the substrate 100 including the recess 115 and thus may be positioned in the recess 115 and on the surface of the substrate 100 around the recess 115 in such a configuration that the cavity A may be provided on an upper surface of the transfer gate 1253 corresponding to the central portion of the recess 115. Thus, the gate insulation pattern 116a and the first and the second gate conductive patterns 1511a and 1512a may have a uniform thickness along the surface profile of the substrate 100 including the recess 115.

The first and the second gate conductive patterns 1511a and 1512a may comprise polysilicon doped with impurities. The second gate conductive pattern 1512a may be positioned on the gate insulation pattern 116a and the first gate conductive pattern 1511a may be positioned on the second gate conductive pattern 1512a, to thereby constitute the third modified transfer gate 1253 in the image sensor 800.

The first gate conductive pattern 1511a may have a first thickness and a first doping concentration, and the second gate conductive pattern 1512a may have a second thickness smaller than the first thickness and a second doping concentration lower than the first doping concentration. In the present example embodiments, the second thickness of the second gate conductive pattern 1512a may be less than about 30% of a total thickness of the gate conductive pattern 151a.

The second gate conductive pattern 1512a having a relatively lower doping concentration and a relatively smaller thickness may be interposed between the gate insulation pattern 116a and the first gate conductive pattern 1511a, which may improve operation characteristics of the transfer transistor in the image sensor 800.

Figure 11:
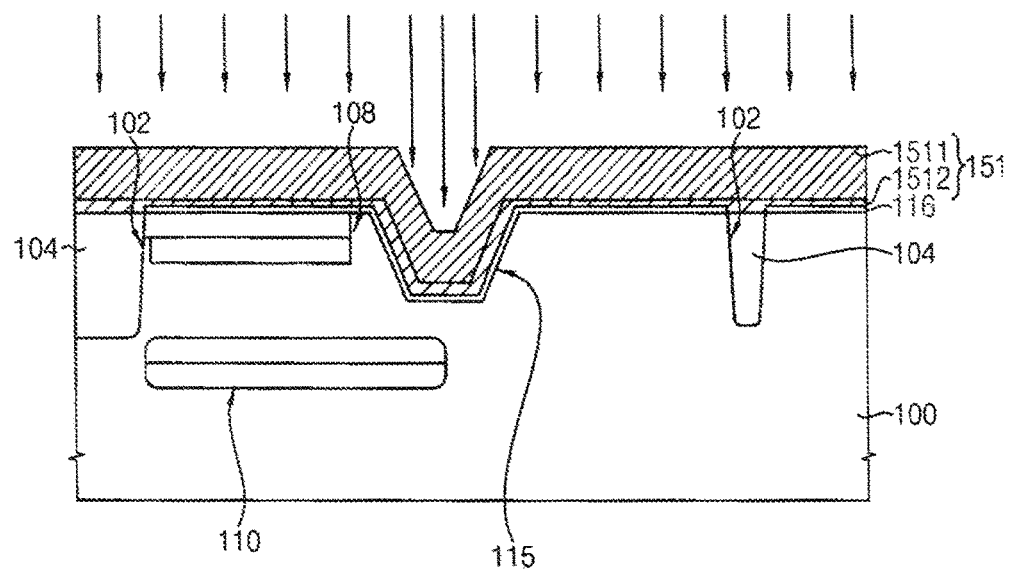
FIG. 11 is a cross-sectional view illustrating a processing step for a method of manufacturing the image sensor shown in FIG. 10.

FIG. 11 is a cross-sectional view illustrating a processing step for a method of manufacturing the image sensor shown in FIG. 10.

The processing steps for manufacturing the image sensor shown in FIG. 10 may be substantially the same as those for manufacturing the image sensor described in detail with reference to FIGS. 9A to 9C, except for the step for forming the third modified transfer gate. Thus, the processing steps for manufacturing the image sensor shown in FIG. 10 will be described around the step for forming the third modified transfer gate without any further descriptions on the same processing steps.

The same structure including the pure polysilicon layer 150 as described with reference to FIG. 9B may be formed through the same processes as described with reference to FIGS. 9A to 9B.

Thereafter, impurities may be implanted into the pure polysilicon layer 150 by an ion implantation process as illustrated in FIG. 11. In such a case, the implantation process may be controlled in such a way that the impurities may be implanted into an upper portion of the pure polysilicon layer 150 by a first doping concentration, and be implanted into a lower portion of the pure polysilicon layer 150 by a second doping concentration lower than the first doping concentration. Thus, the pure polysilicon layer 150 may be transformed into the doped polysilicon layer 151 including a first doped polysilicon layer 1511 and a second doped polysilicon layer 1512 under the first doped polysilicon layer 1511.

For example, the second doped polysilicon layer 1512 may be formed to have a thickness less than about 30% of a thickness of the doped polysilicon layer 151 by controlling the implantation conditions.

Thereafter, the gate insulation layer 116 and the doped polysilicon layer 151 may be patterned into the gate insulation pattern 116a and the gate conductive pattern 151a having the first and the second gate conductive pattern 1511a and 1512a by the same process as described with reference to FIG. 4E. The stack of the gate conductive pattern 151a on the gate insulation pattern 116a may constitute the third modified transfer gate 1253 of the transfer transistor in the image sensor 800.

According to the method of manufacturing the image sensor, because the second gate conductive pattern 1512a may be formed to a sufficiently small thickness, the amount of the impurities may be minimized without the operation characteristics of the transfer gate.

Thereafter, the same process as described with reference to FIGS. 4F to 4G may be further performed to the structure shown in FIG. 11, to thereby form the image sensor 800 shown in FIG. 10.

The above-described image sensors may further include a color filter on the substrate 100, and thus a specific light that may be filtered to have a specific wavelength may be incident onto the photodiodes 108 and 110.

Figure 12:
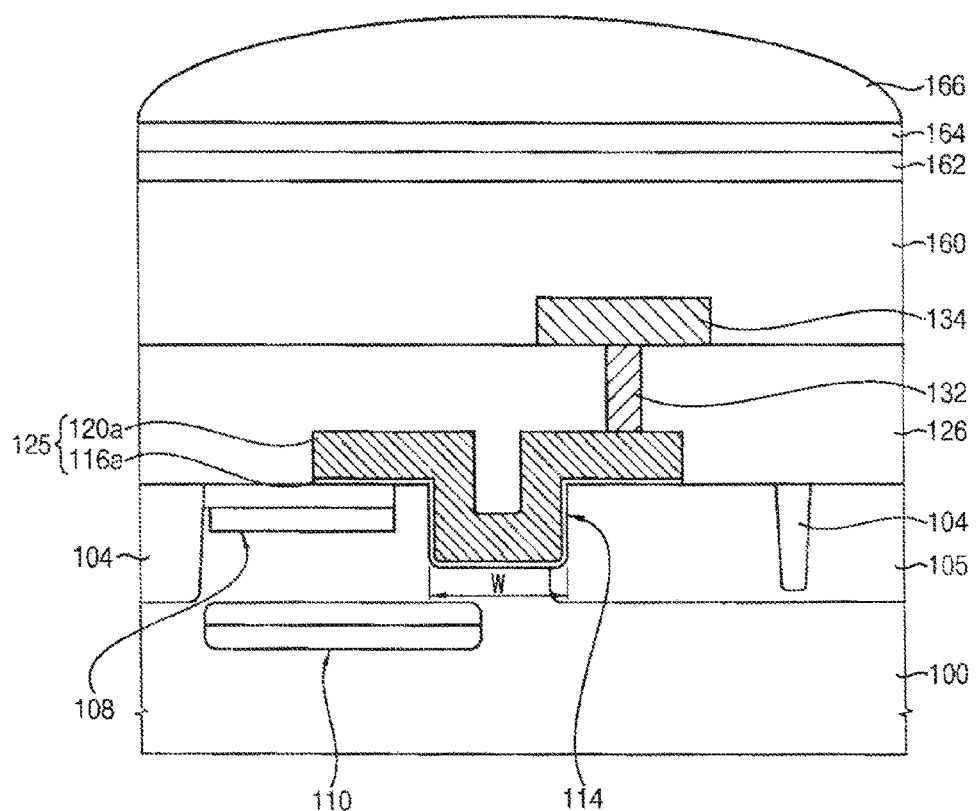
FIG. 12 is a cross-sectional view illustrating an image sensor in accordance with further example embodiments.

FIG. 12 is a cross-sectional view illustrating an image sensor in accordance with still other example embodiments.

In FIG. 12, the image sensor shown in FIG. 3 may be coupled with the color filter in accordance with example embodiments. Thus, other example embodiments of the image sensor shown in FIGS. 6, 8 and 10 may also be coupled with the color filter, as would be known to one of the ordinary skill in the art.

Referring to FIG. 12, an image sensor 1000 may include an additional insulation interlayer 160 on the insulation interlayer 126 in such a way that the wiring lines 134 may be covered with and may be electrically insulated from one another by the additional insulation interlayer 160.

A planarization layer 162 and a color filter layer 164 may be sequentially provided on the additional insulation interlayer 160 and a micro lens 166 may be prepared on the color filter layer 164. The color filter layer 164 may transmit one of a red light, a green light and a blue light having a respective specific wavelength.

Figure 13:
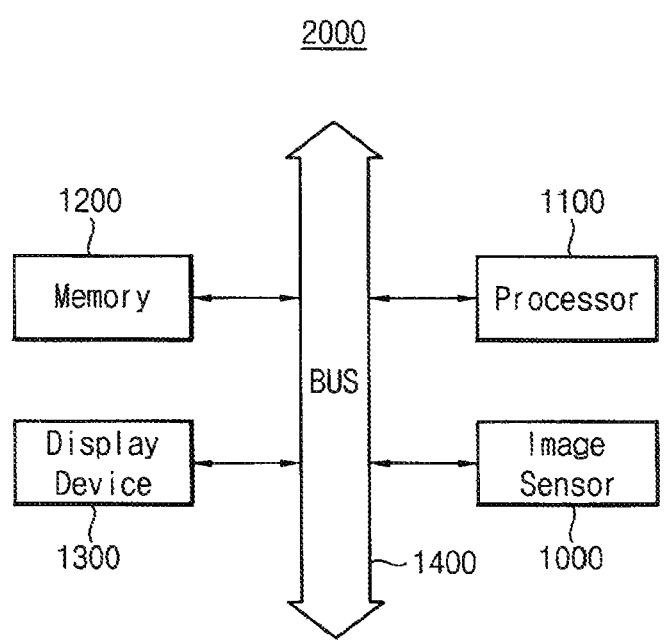
FIG. 13 is a structural block diagram showing an electronic system including the image sensor in accordance with yet further example embodiments.

FIG. 13 is a structural block diagram showing an electronic system including the image sensor in accordance with example embodiments.

For example, the electronic system may include a digital camera and a mobile device.

Referring to FIG. 13, an electronic system 2000 in accordance with example embodiments may include the image sensor 1000 shown in FIG. 12, a micro processor 1100, a memory unit 1200, a display unit 1300 and data bus line 1400 for communicating data among the image sensor 1000, the micro processor 1100, the memory unit 1200 and the display unit 1300.

The image sensor 1000 may generate an image signal according to a control signal from the micro processor 1100. Then, the image signal may be transferred to the memory unit 1200 through the data bus line 1400 and may be stored into a binary digital data in the memory unit 1200 according to the control signal from the micro processor 1100. Further, the image signal may be transformed into a visual image on the display unit 1300 by the micro processor 1100.

According to the present example embodiments, the transfer gate of the image sensor may be formed into a vertical type that may be recessed in the recess of the substrate and may have a cavity at an upper surface thereof corresponding to the central portion of the recess. Due to the cavity, the transfer gate may have a uniform doping concentration along the surface profile of the substrate including the recess. That is, the doping concentration of the transfer gate on the surface of the substrate may be substantially the same as that of the transfer gate in the recess. Accordingly, the vertical transfer gate of the image sensor may have uniform doping concentration in spite of the non-uniformity of the substrate such as the recess, thereby improving the full-well capacity of the pixel of the image sensor. As a result, the drive range of the image sensor may be enlarged and the operation failures such as the image lag may be minimized. In addition, the cavity of the transfer gate may be easily formed without any additional processes, thereby increasing the operation reliability of the image sensor without additional processes.

The image sensor according to example embodiments may be applied to various electronic systems (e.g., a computer system, a digital camera, a three-dimensional camera, a smart phone, a personal digital assistant (PDA), a scanner, a navigation system for a driver, a video phone, a closed circuit television (CCTV) system, an auto-focusing system, a tracking system, a motion sensing system and an image stabilizer).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing an image sensor, comprising:

forming a plurality of photodiodes inside a photoelectric conversion area of a substrate on which a floating diffusion area is separated from the photoelectric conversion area, wherein the plurality of photodiodes are arranged in a vertical direction;

forming a recess on the substrate between the photoelectric conversion area and the floating diffusion area;

forming a gate insulation layer along a surface profile of the substrate having the recess, wherein the gate insulation layer is formed on a sidewall and bottom of the recess and on the surface of a substrate around the recess;

forming a pure polysilicon layer on the gate insulation layer along the surface profile of the substrate;

implanting impurities into the pure polysilicon layer to form a gate conductive layer including polysilicon doped with impurities on the gate insulation layer along the surface profile of the substrate having the recess; and patterning the gate insulation layer and the gate conductive layer to form a transfer gate electrode including a gate insulation pattern and a gate conductive pattern including the polysilicon doped with the impurities along the surface profile of the substrate having the recess, wherein the transfer gate electrode is formed on the sidewall and the bottom of the recess and on the surface of the substrate around the recess and includes a cavity over a central portion of the recess.

2. The method of claim 1, wherein implanting the impurities into the pure polysilicon layer includes performing a first ion implantation process, a second ion implantation process and a third ion implantation process, the first ion implantation process implants the impurities in a vertical line perpendicular to the surface of the substrate, and the second and the third ion implantation processes implant the impurities at a slant angle with respect to the surface of the substrate in a counterclockwise or clockwise direction, respectively, from the vertical line.

3. The method of claim 1, wherein the impurities are implanted into the pure polysilicon layer at a uniform doping concentration throughout an entire thickness of the pure polysilicon layer such that the doping concentration of the gate conductive layer is uniform along a thickness of the gate conductive layer.

4. The method of claim 1, wherein the impurities are implanted into an upper portion of the pure polysilicon layer at a first doping concentration and are implanted into a lower portion of the polysilicon layer at a second doping concentration lower than the first doping concentration such that the gate conductive layer includes a first doped polysilicon layer having the first doping concentration and a second doped polysilicon layer having the second doping concentration under the first doped polysilicon layer.

5. The method of claim 1, wherein a thickness of the gate conductive layer is uniform along the surface profile of the substrate including the recess such that the thickness of the gate conductive layer is less than a half of an inner width of the recess.

6. The method of claim 1, wherein forming the recess on the substrate includes performing an etching process, and
- a corner angle of the substrate between the surface of the substrate and the sidewall of the recess is in a range of 90° to about 140° after the etching process.

7. The method of claim 1, wherein further comprising:
- forming an insulation interlayer on the substrate and covering the transfer gate electrode; and
- forming a contact plug extending through the insulation interlayer and contacting the transfer gate electrode on a portion of the transfer gate electrode spaced apart from the cavity.

* * * * *